(12) United States Patent
Choi

(10) Patent No.: US 7,833,861 B2
(45) Date of Patent: Nov. 16, 2010

(54) SEMICONDUCTOR DEVICE HAVING RECESS CHANNEL STRUCTURE AND METHOD FOR MANUFACTURING THE SAME

(75) Inventor: Kang Sik Choi, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 507 days.

(21) Appl. No.: 11/865,646

(22) Filed: Oct. 1, 2007

(65) Prior Publication Data
US 2008/0157191 A1 Jul. 3, 2008

(30) Foreign Application Priority Data
Dec. 28, 2006 (KR) .................. 10-2006-0137217

(51) Int. Cl.
*H01L 21/336* (2006.01)
*H01L 21/762* (2006.01)

(52) U.S. Cl. .................. 438/270; 438/296; 257/330; 257/E21.429

(58) Field of Classification Search .................. 438/221, 438/270, 296; 257/330, 331, 332, E21.419, 257/E21.428, E21.429
See application file for complete search history.

(56) References Cited

U.S. PATENT DOCUMENTS

| | | | |
|---|---|---|---|
| 7,071,107 B2 * | 7/2006 | Hieda et al. .................. | 438/691 |
| RE39,690 E * | 6/2007 | Kalnitsky et al. ........... | 257/644 |
| 7,332,408 B2 * | 2/2008 | Violette ..................... | 438/435 |
| 7,588,985 B2 * | 9/2009 | Kim .......................... | 438/270 |
| 2004/0173812 A1 * | 9/2004 | Currie et al. ................ | 257/103 |
| 2005/0205859 A1 * | 9/2005 | Currie et al. ................ | 257/19 |
| 2005/0233540 A1 | 10/2005 | Yoon et al. | |
| 2006/0091475 A1 * | 5/2006 | Fujii et al. .................. | 257/374 |
| 2006/0113590 A1 * | 6/2006 | Kim et al. ................... | 257/330 |
| 2006/0118880 A1 * | 6/2006 | Komoda ..................... | 257/369 |
| 2006/0151838 A1 * | 7/2006 | Chidambarrao ............ | 257/374 |
| 2006/0186436 A1 * | 8/2006 | Tamura et al. .............. | 257/192 |
| 2007/0063270 A1 * | 3/2007 | Cho et al. ................... | 257/330 |
| 2007/0158721 A1 * | 7/2007 | Akamatsu ................... | 257/296 |

FOREIGN PATENT DOCUMENTS

| | | |
|---|---|---|
| CN | 1702845 | 11/2005 |
| JP | 2004-235332 | 8/2004 |
| KR | 1020050112790 A | 12/2005 |

OTHER PUBLICATIONS

Goto et al., "High Performance 35 nm Gate CMOSFETs with Vertical Scaling and Total Stress Control for 65 nm Technology," *2003 Symposium on VLSI Technology Digest of Technical Papers*, pp. 49-50.

* cited by examiner

*Primary Examiner*—David Vu
*Assistant Examiner*—Earl N Taylor
(74) *Attorney, Agent, or Firm*—Townsend and Townsend and Crew LLP

(57) ABSTRACT

A semiconductor device having a recess channel structure includes a semiconductor substrate having a recess formed in a gate forming area in an active area; an insulation layer formed in the semiconductor substrate so as to define the active area and formed so as to apply a tensile stress in a channel width direction; a stressor formed in a surface of the insulation layer and formed so as to apply a compressive stress in a channel height direction; a gate formed over the recess in the active area; and source/drain areas formed in a surface of the active area at both side of the gate.

9 Claims, 6 Drawing Sheets

(100)Surface and <110> Channel

| Stress Component | nMOS | pMOS |
|---|---|---|
| +1 GPa along channel(X) | +32% | -72% |
| -1 GPa along channel(X) | -32% | +72% |
| +1 GPa along channel(Z) | +18% | +66% |
| -1 GPa along channel(Z) | -18% | -66% |
| +1 GPa along channel(Y) | -53% | +1% |
| -1 GPa along channel(Y) | +53% | -1% |

SEMICONDUCTOR DEVICE HAVING RECESS CHANNEL STRUCTURE AND METHOD FOR MANUFACTURING THE SAME

CROSS-REFERENCE TO RELATED APPLICATIONS

The present application claims priority to Korean patent application number 10-2006-0137217, filed on Dec. 28, 2006, which is incorporated herein by reference in its entirety.

BACKGROUND OF THE INVENTION

The present invention relates to a semiconductor device having a stressor or stress applying layer and a method for manufacturing the same.

As semiconductor memory devices are made smaller, existing MOSFET structures have been found to be inadequate in providing a sufficient threshold voltage margin and refresh characteristics. Accordingly, various studies are being conducted to ensure the semiconductor device is provided with the sufficient threshold voltage as well adequate refresh characteristics, i.e., to counter the short channel effects.

One type of semiconductor devices uses a recess channel structure as a solution to the short channel effects experienced by the conventional lateral semiconductor device. The recess channel structure is a structure in which a channel area is recessed in U-shape to lengthen the effective channel length. This enables the device to minimize the short channel effects. Therefore, the recess channel structure is employed in many recent semiconductor devices.

Particularly, formation of a shallow junction has been used to ensure a Drain Induced Barrier Lowering (DIBL) margin according to a decrease in a channel length before the recess channel structure is suggested. Of course, even in this case, formation of a Punch Through Stop Layer through an ion implantation process to below the source and the drain for cutting off a drift current due to a strong electric field between a source and a drain is applied as a basic process.

However, because it is necessary to reduce a depletion area of the source and the drain through the shallow junction in order to form a channel length of nm range, a transistor having a three dimensional shape, such as, the recess channel structure, has been implemented recently.

In the recess channel structure, the current flows in a plurality of directions on a plurality of surfaces instead of in a single direction on a single surface as in the conventional transistor. One issue associated with the recess channel structure is that electron mobility may be inconsistent from one another.

Specifically, FIG. 1 is a cross-sectional view illustrating a conventional MOSFET device having a recess channel structure, FIG. 2 is a view for explaining a crystal plane and a current flow and FIG. 3 is a graph for explaining an electron mobility according to the crystal plane. With reference to the drawings, description to the conventional MOSFET device having a recess channel structure will be made.

Referring to FIG. 1, an isolation layer 104 for defining active areas 102 is formed on a semiconductor substrate 100, a recess R is formed in the active area 102, a gate 120 is formed on the recess R and source/drain areas 122 are formed in a surface of the active area 102 at both sides of the gate 120.

In FIG. 1, a reference symbol 108 denotes a threshold voltage adjusting area, 110 denotes a gate insulation layer, 112 denotes a polysilicon layer, 114 denotes a metal based layer, 116 denotes a hard mask layer and 118 denotes a gate spacer.

The MOSFET device having such recess channel structure is generally formed on the semiconductor substrate 100 consisting of silicon lattices on the basis of a surface (110). Further, unlike current flows in a single direction <110> on the surface (100) in a planar MOSFET device, as shown in FIG. 2, at least two types of current exist in the MOSFET device having the recess channel structure formed on the semiconductor substrate 100 on the basis of the surface (110), i.e., a current flow A flowing in the direction <110> along the surface (100) at a bottom of the recess and a current flow B flowing in a direction <100> along the surface (110) at a side surface of the recess. At this time, the current flow in the MOSFET device having the recess channel are in a sequence of (110)/<100>, (100)/<110> and (110)/<100>.

Comparing the two current flows occurring in the MOSFET device having the recess channel, as shown in FIG. 3, it can be appreciated that an electron mobility in the current flowing horizontally along the bottom of the recess, i.e. flowing direction <110> along surface (100) is larger than an electron mobility in the current flowing vertically along the side surface of the recess, i.e. flowing direction <100> along surface (110).

Therefore, an electron mobility in the MOSFET device having the recess channel is generally determined by the electron mobility in the current flowing horizontally along the bottom of the recess, i.e. flowing direction <110> along surface (100).

However, in the MOSFET device having the recess channel, the low electron mobility in the current flowing vertically along the side surface of the recess, i.e. flowing direction <100> along surface (110) causes a slow operation speed, particularly a slow writing time. Therefore, the electron mobility in the current flowing direction <100> along surface (110) should be increased to improve the operation speed of the MOSFET device having the recess channel.

BRIEF SUMMARY OF THE INVENTION

Embodiments of the present invention are directed to a stressor to apply a stress of a first type to offset a stress of a second type being exerted on the substrate.

The semiconductor device of the present invention is a MOSFET device in one embodiment. The MOSFET device may be implemented with a recess channel structure.

In one embodiment, a semiconductor device having a recess channel structure may comprise a semiconductor substrate having a recess formed in a gate forming area in an active area; an insulation layer formed in the semiconductor substrate so as to define the active area and formed so as to apply a tensile stress in a channel width direction; a stressor formed in a surface of the insulation layer and formed so as to apply a compressive stress in a channel height direction; a gate formed over the recess in the active area; and source/drain areas formed in a surface of the active area at both side of the gate.

The isolation layer is made of a SOD layer or a nitride layer according to a LPCVD process.

The stressor is formed in a portion of the isolation layer which extends to a bit line contact area in the active area.

The stressor is made of a HDP layer or a nitride layer according to a PECVD process.

The stressor is formed to a depth of from a depth deeper than a depth of the source/drain area to a bottom of the isolation layer.

The stressor is formed to have a width of F/2 to 4F, wherein F is a Feature size.

In another embodiment, a method for manufacturing a MOSFET device having a recess channel structure may comprise forming a mask pattern for exposing some portion of the isolation layer over the semiconductor substrate including the isolation layer; etching the exposed portion of the isolation layer to form a trench; removing the mask pattern; depositing an insulation material so as to fill in the trench; and planarizing the insulation material.

The isolation layer is made of a SOD layer or a nitride layer according to a LPCVD process.

The step of forming the stressor may comprises forming a mask pattern for exposing some portion of the isolation layer over the semiconductor substrate including the isolation layer; etching the exposed portion of the isolation layer to form a trench; removing the mask pattern; depositing an insulation material so as to fill in the trench; and planarizing the insulation material.

The mask pattern is formed so as to expose a bit line contact area in the active area and a portion of the isolation layer extending thereto.

The stressor is made of a HDP layer or a nitride layer according to a PECVD process.

The stressor is formed to a depth of from a depth deeper than a depth of the source/drain area to a bottom of the isolation layer.

The stressor is formed to have a width of F/2 to 4F, wherein F is a Feature size.

The method may further comprise, after the step of forming the stressor, the step of forming a threshold voltage adjusting area in the semiconductor substrate.

DESCRIPTION OF SPECIFIC EMBODIMENTS

Figure 1:
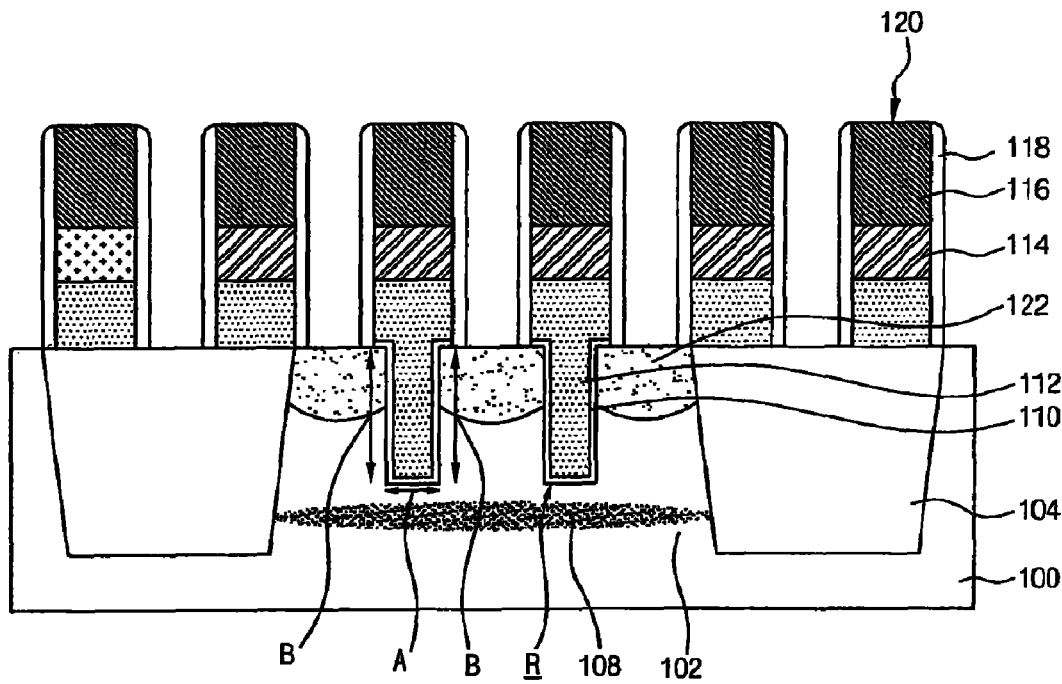
FIG. 1 is a cross-sectional view illustrating a conventional MOSFET device having a recess channel structure.
Figure 2:
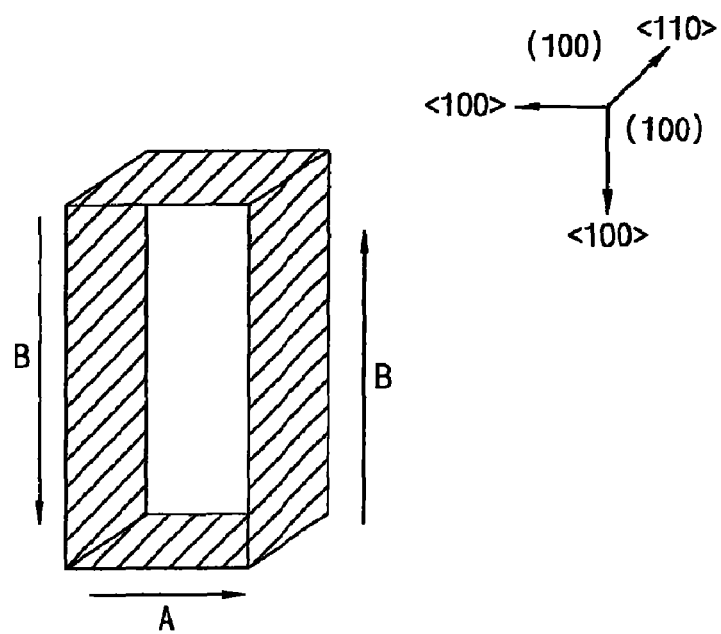
FIG. 2 is a view for explaining a crystal plane and a current flow.
Figure 3:
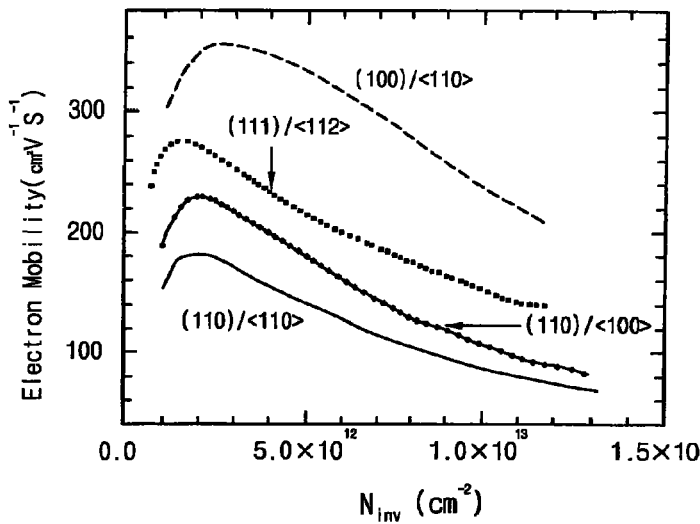
FIG. 3 is a graph for explaining an electron mobility according to the crystal plane.
Figure 4:
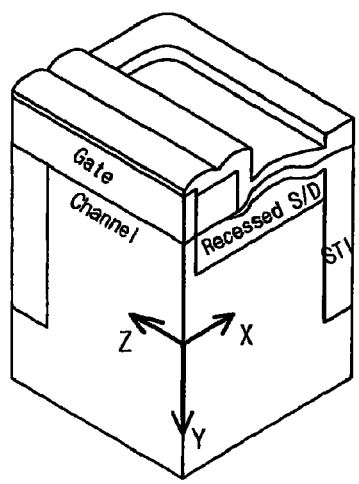
FIG. 4 is a view for explaining variation in an electron mobility according to a stress component in a MOSFET device having a recess channel structure.

FIG. 4 is a view for explaining variation in an electron mobility according to a stress component in a semiconductor device (e.g., MOSFET device) having a recess channel structure. Because an electron mobility is larger in a direction <110> than in a direction <100>, current characteristics of a MOSFET device having a recess channel structure is determined by the direction <100>. Further, the electron mobility in the direction <100> is increased and decreased as a shape of an external stress.

For illustrative convenience, the invention will be explained using a MOSFET device having a recess channel structure. As will be understood by those skilled in the art, the invention is limited to a device having the recess channel structure nor to a MOSFET device.

As shown in FIG. 4, it can be appreciated that the variation in an electron mobility according to a stress component in a MOSFET device having a recess channel structure is increased when a tensile stress is applied in a channel width direction Z and a channel length direction X and a compressive stress is applied in a channel height direction Y.

Therefore, an embodiment of the present invention is directed to a MOSFET device having a recess channel structure in which a tensile stress is applied in the channel width direction Z and a compressive stress is applied in the channel height direction Y. In this case, since an electron mobility in a direction <110> on a surface (100) can be increased, an operation speed including a writing speed can be improved.

Figure 5:
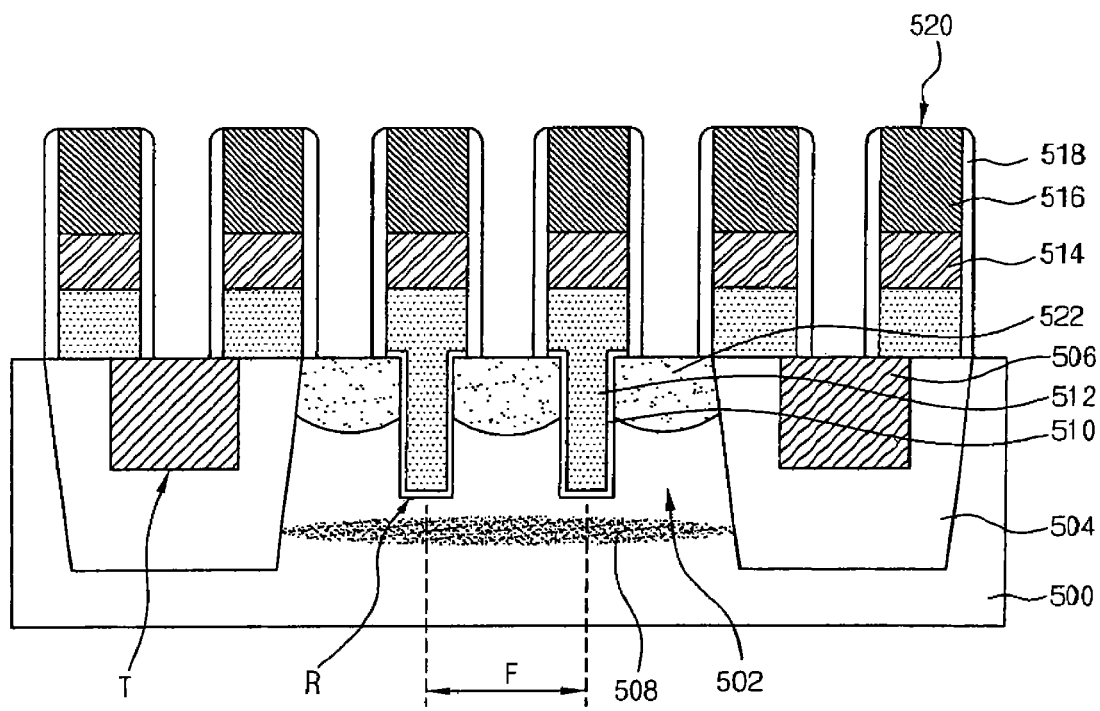
FIG. 5 is a cross-sectional view illustrating a MOSFET device having a recess channel structure in accordance with an embodiment of the present invention.

FIG. 5 is a cross-sectional view illustrating a MOSFET device having a recess channel structure in accordance with an embodiment of the present invention.

As shown, an isolation layer (or isolation structure) 504 for defining active areas 504 is formed over a semiconductor substrate 500. A stressor 506 made of an insulation material is formed at least partly in the isolation layer 504. Also, a recess R is formed in the active area 503, a gate 520 is formed over the recess R and source/drain areas 522 are formed in the active area 502 at both sides of the gate 520.

The isolation layer 504 is made of an insulation material capable of applying a tensile stress in a channel width direction, for example, a spin-on dielectric (SOD) layer or a nitride layer formed by a low pressure chemical vapor deposition (LPCVD) process. The stressor 506 is made of an insulation material capable of applying a compressive stress in a channel height direction, for example, a high density plasma (HDP) layer or a nitride layer formed by a plasma enchanced chemical vapor deposition (PECVD) process. In one embodiment, the stressor 506 is formed to a depth that is deeper than a depth of the source/drain area 522 and may extend to a bottom of the isolation layer 504. The stressor is provided with from F/2 to 4F. Here, F is a Feature size which indicates a distance between the each center of two adjacent gates.

In FIG. 5, the device includes a threshold voltage adjusting area 508, a gate insulation layer 510, a polysilicon layer 512, a metal based layer 514, a hard mask layer 516 and a gate spacer 518.

As such, in an embodiment of the present invention, the isolation layer is formed so as to apply a tensile stress in a channel width direction and the stressor is formed in the surface of the isolation layer so as to apply a compressive stress in a channel height direction. Therefore, in a MOSFET device in accordance with an embodiment of the present invention, since an electron mobility in a direction <100> can be increased, writing time can be reduced and an operation speed can be improved.

Hereafter, a method for manufacturing the MOSFET device in accordance with an embodiment of the present invention will be described with reference to FIGS. 6A through 6C.

Figure 6A:
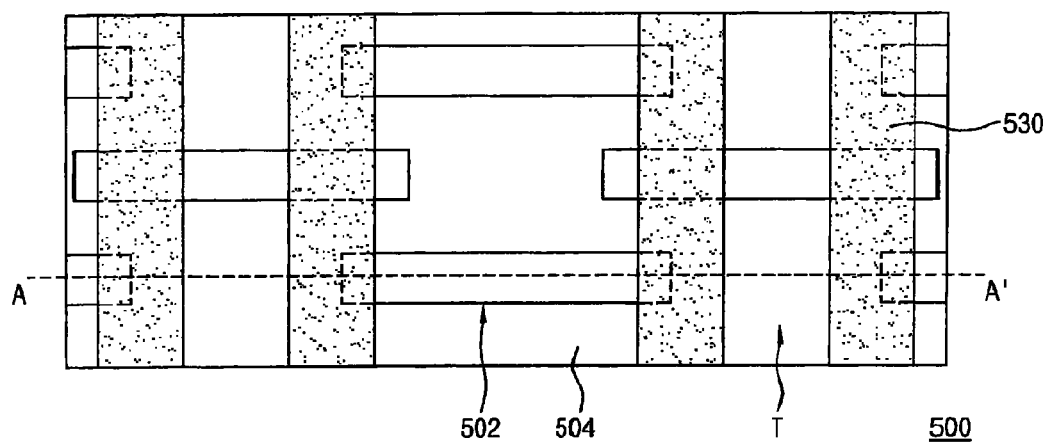
FIGS. 6A through 6C are plan views and cross-sectional views illustrating the process steps of a method for manufacturing the semiconductor package in accordance with an embodiment of the present invention.
Figure 6A:
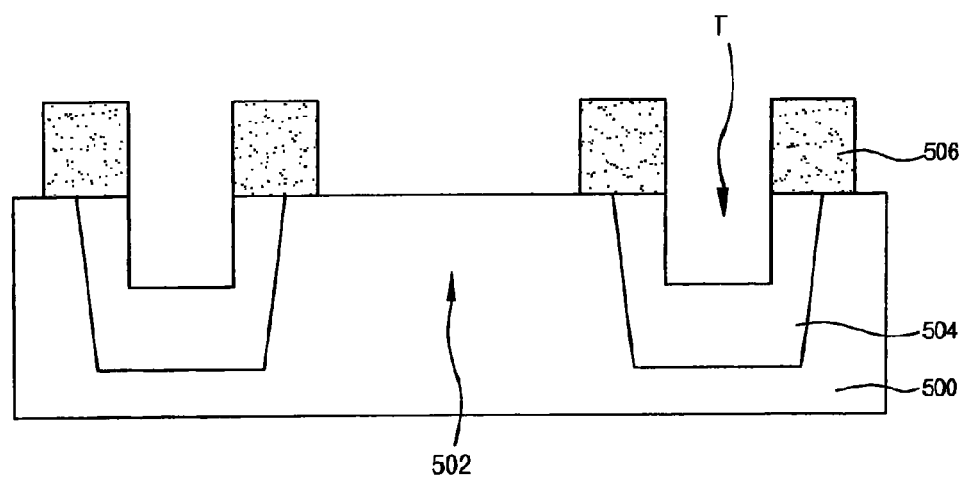

Referring to FIG. 6A, the isolation layer 504 for defining the active areas 502 is formed in the semiconductor substrate 500 using a Shallow Trench Isolation (STI) process. The isolation layer 504 is formed by filling an insulation material made of, for example, a SOD layer or a nitride layer according to a LPCVD process in a trench so as to apply a tensile stress in the channel width direction. A mask pattern 530 is provided for exposing a bit line contact region in the active area 502 and a portion of the isolation layer extending thereto over the semiconductor substrate 500. The mask pattern 530 is formed using photoresist material. The exposed portion of the isolation layer 504 is selectively etched using the mask pattern 530 as an etching mask to form a trench T. Herein, the mask pattern 530 is formed so as to expose a portion of the isolation layer. The portion has a length F/2 to 4F. The isolation layer is etched using the mask pattern 530 to form the trench T having a depth that is deeper than that of the source/drain area. In one embodiment, the depth of trench T extends to a bottom of the isolation layer 504. In another embodiment, the depth of the trench T extends beyond the bottom of the isolation layer 504.

Figure 6B:
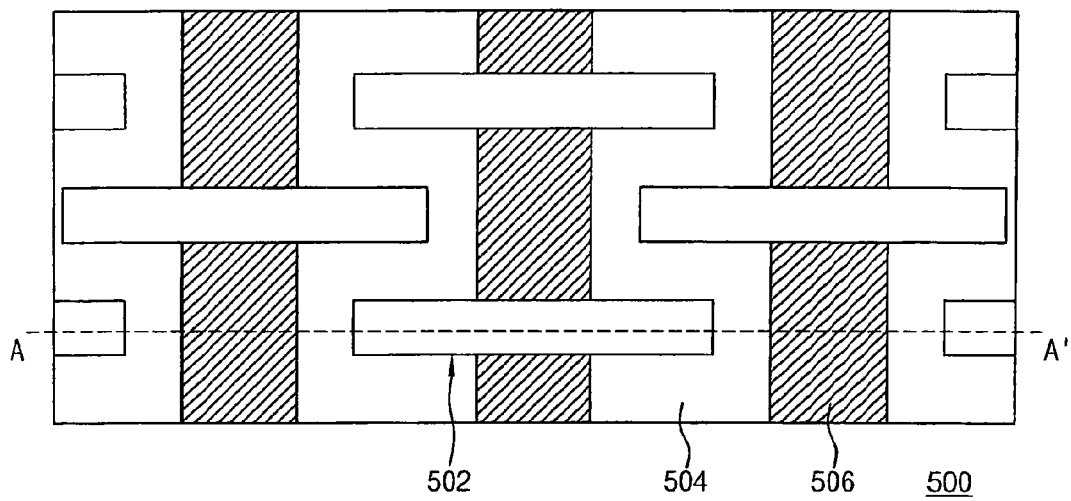
Figure 6B:
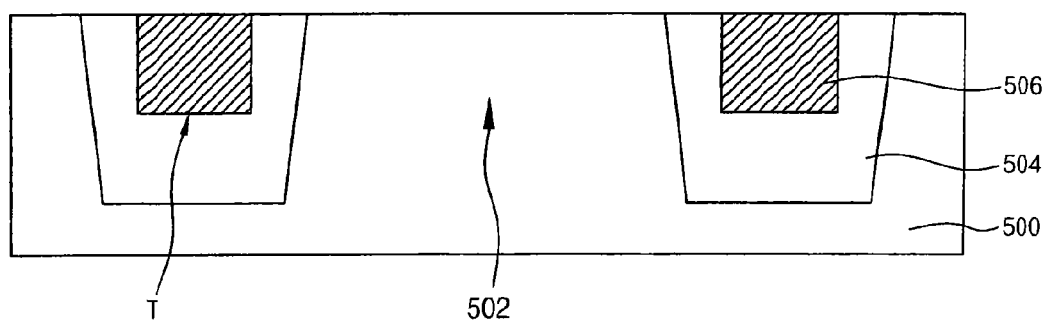

Referring to FIG. 6B, the mask pattern is removed. An insulation material is deposited over the semiconductor substrate 500 so as to fill in the trench T. A planarization process, e.g., a chemical mechanical polishing (CMP) process, is performed to form the stressor 506 in the trench T, so that the upper surface of the stressor and that of the isolation layer 504 are flushed to each other. The stressor 506 applies a compressive stress in a channel height direction. In one embodiment, the stressor is formed from a HDP layer or a nitride layer according to a PECVD process. In another embodiment, an etch back process is used to form the stress 506 instead of the CMP process, in which case the upper surface of the stressor may not be flushed to that of the isolation layer.

Figure 6C:
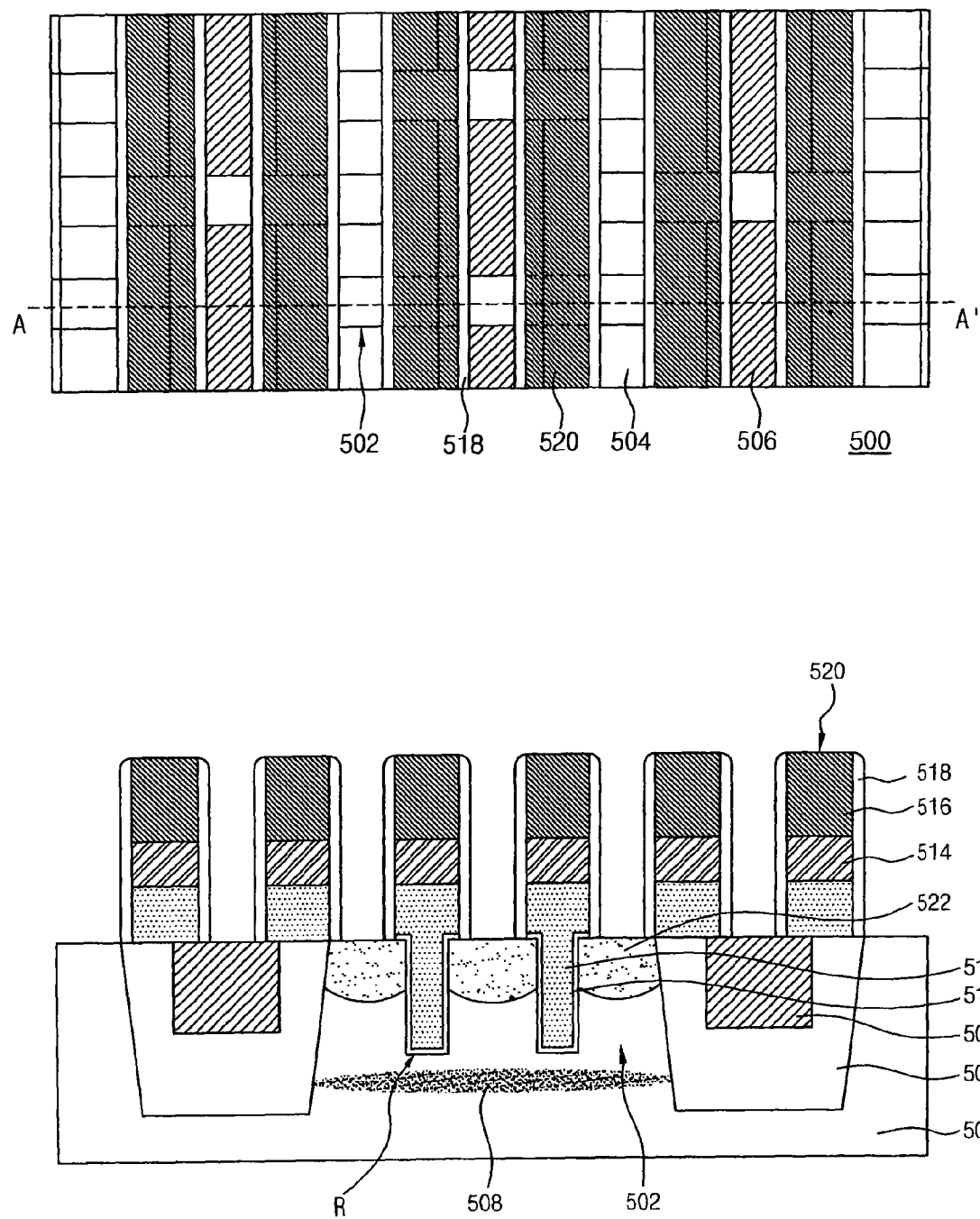

Referring to FIG. 6C, an ion implantation process is performed in the active areas 502 of the semiconductor substrate 500 defined by the isolation layer 504 to formed the threshold voltage adjusting area 508 and the source/drain areas 522. A recess mask (not shown) for exposing areas where a gate in the active area 502 is is formed over the semiconductor substrate 500. The exposed gate forming area is etched using the recess mask as an etching mask to form the recess R.

Next, the recess mask is removed. The gate insulation layer 510, the polysilicon layer 512, the metal based layer 514 and the hard mask layer 516 are sequentially formed over the semiconductor substrate 500 including the recess R. Then, the hard mask layer 516, the metal based layer 514, the polysilicon layer 512 and the gate insulation layer 510 are etched to form the gate 520 over the recess R. The gate spacers 520 is formed at both side walls of the gate 520, thereby completing a manufacturing of the MOSFET device having a recess channel structure in accordance with an embodiment of the present invention.

Meanwhile, in one embodiment of the present invention described above, the etching of the isolation layer for forming the stressor is performed after removing a pad oxide layer and a pad nitride layer which are used as hard mask in the STI process. In another embodiment, a photoresist pattern is formed and then the isolation layer is etched while the pad oxide layer and the pad nitride layer have not been removed.

As is apparent from the above description, in a MOSFET device having a recess channel structure in accordance with an embodiment of the present invention, a tensile stress is applied in a channel width direction and a compressive stress is applied in a channel height direction. For this end, in an embodiment of the present invention, an isolation layer is formed so that a tensile stress can be applied in the channel width direction and a stressor for applying a compressive stress in the channel height direction is further formed in a surface of the isolation layer. Therefore, in an embodiment of the present invention, since an electron mobility in a direction <100> in a MOSFET device having a recess channel structure can be increased, it is possible to improve an operation speed of a semiconductor memory device, for example effectively reduce a writing time.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising:
    forming an isolation structure in a semiconductor substrate to define an active region, the isolation structure configured to apply a stress of a first type in a channel width direction;
    forming a stressor at least partly within the isolation structure, the stressor being configured to apply a stress of a second type in a channel height direction;
    forming first and second doped regions in the active region;
    forming a recess in the active area; and
    forming a gate between the first and second doped regions, the gate being at least partly within the recess.

2. The method for manufacturing a device according to claim 1, wherein the stress of the first type is a tensile stress and the stress of the second type is a compressive stress.

3. The method for manufacturing a device according to claim 1, wherein the step of forming the stressor comprises:
    forming a mask pattern to expose a portion of the isolation structure;
    etching the exposed portion of the isolation structure to form a trench that extends at least as deep as the first and second doped regions;
    removing the mask pattern;
    depositing an insulation material to fill in the trench; and
    planarizing the insulation material to form the stressor.

4. The method for manufacturing a device according to claim 3, wherein the mask pattern is formed so as to expose a bit line contact area in the active region and a portion of the isolation structure extending thereto.

5. The method for manufacturing a device according to claim 1, wherein the isolation structure is made of a SOD layer or a nitride layer according to a LPCVD process, and the stressor is made of a HDP layer or a nitride layer according to a PECVD process.

6. The method for manufacturing a device according to claim 1, wherein the stressor is formed to a depth that is deeper than that of the first and second doped regions, the first and second doped region being source/drain regions.

7. The method for manufacturing a MOSFET device according to claim 1, wherein the stressor is formed to have a width of F/2 to 4F, wherein F is a Feature size which indicates a distance between the each center of two adjacent gates.

8. The method for manufacturing a device according to claim 1, further comprising, forming a threshold voltage adjusting area in the semiconductor substrate after forming the stressor.

9. The method for manufacturing a device according to claim 1, wherein the device is a MOSFET device.

* * * * *